(12) United States Patent
Sills

(10) Patent No.: US 10,355,002 B2
(45) Date of Patent: *Jul. 16, 2019

(54) MEMORY CELLS, METHODS OF FORMING AN ARRAY OF TWO TRANSISTOR-ONE CAPACITOR MEMORY CELLS, AND METHODS USED IN FABRICATING INTEGRATED CIRCUITRY

(71) Applicant: Micron Technology, Inc., Boise, ID (US)

(72) Inventor: Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

This patent is subject to a terminal disclaimer.

(21) Appl. No.: 15/667,159

(22) Filed: Aug. 2, 2017

(65) Prior Publication Data

US 2018/0061840 A1 Mar. 1, 2018

Related U.S. Application Data

(60) Provisional application No. 62/381,737, filed on Aug. 31, 2016.

(51) Int. Cl.
*H01L 49/02* (2006.01)
*H01L 27/108* (2006.01)
(Continued)

(52) U.S. Cl.
CPC .. *H01L 27/10844* (2013.01); *H01L 21/76897* (2013.01); *H01L 28/60* (2013.01);
(Continued)

(58) Field of Classification Search
CPC ... H01L 27/11507; H01L 28/60; H01L 28/90; H01L 28/91; H01L 27/10844
See application file for complete search history.

(56) References Cited

U.S. PATENT DOCUMENTS 4,103,342 A 7/1978 Miersch et al.
4,554,570 A 11/1985 Jastrzebski
(Continued)

FOREIGN PATENT DOCUMENTS

JP 2003-303901 10/2003
JP 2011-142256 7/2007
(Continued)

OTHER PUBLICATIONS

Chun et al.; "A 3T Gain Cell Embedded DRAM Utilizing Preferential Boosting for High Density and Low Power On-Die Caches"; IEEE Journal of Solid-State Circuits; vol. 46, No. 6, Jun. 2011; pp. 1495-1505.
(Continued)

*Primary Examiner* — Nicholas J Tobergte
(74) *Attorney, Agent, or Firm* — Wells St. John P.S.

(57) ABSTRACT

A memory cell comprises first and second transistors laterally displaced relative one another. A capacitor is above the first and second transistors. The capacitor comprises a container-shape conductive first capacitor node electrically coupled with a first current node of the first transistor, a conductive second capacitor node electrically coupled with a first current node of the second transistor, and a capacitor dielectric material between the first capacitor node and the second capacitor node. The capacitor dielectric material extends across a top of the container-shape first capacitor node. Additional embodiments and aspects, including method, are disclosed.

19 Claims, 15 Drawing Sheets

(51) Int. Cl.
*H01L 21/768* (2006.01)
*H01L 27/11507* (2017.01)

(52) U.S. Cl.
CPC .............. *H01L 28/90* (2013.01); *H01L 28/91* (2013.01); *H01L 27/11507* (2013.01)

(56) References Cited

U.S. PATENT DOCUMENTS

| | | |
|---|---|---|
| 5,066,607 A | 11/1991 | Banerjee |
| 5,299,155 A | 3/1994 | Yanagi |
| 5,389,810 A | 2/1995 | Agata |
| 5,571,743 A | 11/1996 | Henkels et al. |
| 5,646,900 A | 7/1997 | Tsukude et al. |
| 6,154,387 A | 11/2000 | Takata |
| 6,483,737 B2 | 11/2002 | Takeuchi et al. |
| 6,563,727 B1 | 5/2003 | Roth et al. |
| 6,720,609 B2 | 4/2004 | Deboer et al. |
| 6,744,087 B2 | 6/2004 | Misewich |
| 6,961,271 B2 | 11/2005 | Jeon et al. |
| 7,330,388 B1 | 2/2008 | Chapman et al. |
| 7,378,702 B2 | 5/2008 | Lee |
| 7,408,218 B2 | 8/2008 | Akiyama et al. |
| 7,558,097 B2 | 7/2009 | Khellah et al. |
| 7,697,318 B2 | 4/2010 | Fukuda et al. |
| 8,212,311 B2 | 7/2012 | Masuoka et al. |
| 8,394,699 B2 | 3/2013 | Haller et al. |
| 8,866,208 B2 | 10/2014 | Lee |
| 9,343,507 B2 | 5/2016 | Takaki |
| 9,378,780 B1 | 6/2016 | Chang et al. |
| 10,157,926 B2 * | 12/2018 | Yang .................... H01L 27/108 |
| 2001/0053088 A1 | 12/2001 | Forbes |
| 2002/0044477 A1 | 4/2002 | Takeuchi et al. |
| 2003/0087499 A1 | 5/2003 | Lane et al. |
| 2003/0169616 A1 | 9/2003 | Noro |
| 2003/0173593 A1 | 9/2003 | Miyatake |
| 2003/0202391 A1 | 10/2003 | Nishimura et al. |
| 2003/0234413 A1 | 12/2003 | Sberno et al. |
| 2004/0062101 A1 | 4/2004 | Kasuga |
| 2004/0151020 A1 | 8/2004 | Beer |
| 2004/0174733 A1 | 9/2004 | Kirihata et al. |
| 2004/0232497 A1 | 11/2004 | Akiyama |
| 2004/0252542 A1 | 12/2004 | Hoya et al. |
| 2006/0028859 A1 | 2/2006 | Forbes |
| 2006/0046424 A1 | 3/2006 | Chance et al. |
| 2006/0138466 A1 | 6/2006 | Choi |
| 2006/0211194 A1 | 9/2006 | Haller |
| 2007/0034928 A1 | 2/2007 | Cook et al. |
| 2007/0161179 A1 | 7/2007 | Lee |
| 2007/0295995 A1 | 12/2007 | Yun |
| 2009/0008691 A1 | 1/2009 | Lee et al. |
| 2009/0108881 A1 | 4/2009 | Wilson |
| 2009/0168489 A1 | 7/2009 | Madan et al. |
| 2009/0212338 A1 | 8/2009 | Benson |
| 2010/0165704 A1 | 7/2010 | Wu et al. |
| 2010/0238697 A1 | 9/2010 | Juengling |
| 2010/0264484 A1 | 10/2010 | Masuoka et al. |
| 2010/0295110 A1 | 11/2010 | Takaishi |
| 2012/0153371 A1 | 6/2012 | Chen et al. |
| 2013/0161607 A1 | 6/2013 | Yoneda |
| 2013/0221356 A1 | 8/2013 | Yamazaki |
| 2013/0235641 A1 | 9/2013 | Iwaki |
| 2013/0235642 A1 | 9/2013 | Heineck et al. |
| 2014/0035018 A1 | 2/2014 | Lee |
| 2014/0054718 A1 | 2/2014 | Karda et al. |
| 2014/0220749 A1 | 8/2014 | Rutter |
| 2015/0041885 A1 | 2/2015 | Yoshida et al. |
| 2015/0078056 A1 | 3/2015 | Liu |
| 2015/0318285 A1 | 11/2015 | Zhang |
| 2016/0071843 A1 | 3/2016 | Kadoya |
| 2016/0079247 A1 | 3/2016 | Lim et al. |
| 2018/0061835 A1 | 3/2018 | Yang et al. |

FOREIGN PATENT DOCUMENTS

| | | |
|---|---|---|
| KR | 10-2007-0070021 | 7/2007 |
| KR | 10-2016-0032559 | 3/2016 |
| TW | 201025352 | 7/2010 |
| TW | I402915 | 7/2013 |
| TW | 106128404 | 8/2018 |
| WO | WO PCT/2017/045052 | 11/2017 |
| WO | WO PCT/US2017/044611 | 11/2017 |
| WO | WO PCT/US2017/044633 | 11/2017 |
| WO | WO PCT/US2017/044638 | 11/2017 |
| WO | WO PCT/US2017/044653 | 11/2017 |
| WO | WO PCT/US2017/044661 | 11/2017 |

OTHER PUBLICATIONS

Henkels et al.; "Large-Signal 2T, 1C DRAM Cell: Signal and Layout Analysis"; IEEE Journal of Solid-State Circuits; vol. 29, No. 7; Jul. 1994; pp. 829-832.

* cited by examiner

US 10,355,002 B2

MEMORY CELLS, METHODS OF FORMING AN ARRAY OF TWO TRANSISTOR-ONE CAPACITOR MEMORY CELLS, AND METHODS USED IN FABRICATING INTEGRATED CIRCUITRY

RELATED PATENT DATA

This patent claims priority to U.S. Provisional Patent Application Ser. No. 62/381,737, which was filed Aug. 31, 2016.

TECHNICAL FIELD

Embodiments disclosed herein pertain to memory cells, to methods of forming memory cells, and to methods used in fabricating integrated circuitry.

BACKGROUND

Dynamic Random Access Memory (DRAM) is used in modern computing architectures. DRAM may provide advantages of structural simplicity, low cost, and speed in comparison to other types of memory.

Presently, DRAM commonly has individual memory cells that have one capacitor in combination with a field effect transistor (so-called 1T-1C memory cells), with the capacitor being coupled with one of the source/drain regions of the transistor. One of the limitations to scalability of present 1T-1C configurations is that it is difficult to incorporate capacitors having sufficiently high capacitance into highly-integrated architectures. Accordingly, it would be desirable to develop new memory cell configurations suitable for incorporation into highly-integrated modern memory architectures.

While the invention was motivated by architecture and method associated with other than 1T-1C memory cells, some aspects of the invention are in no way so limited and may have applicability to any memory cell and to methods used in fabricating any integrated circuitry.

DETAILED DESCRIPTION OF EXAMPLE EMBODIMENTS

Figure 1:
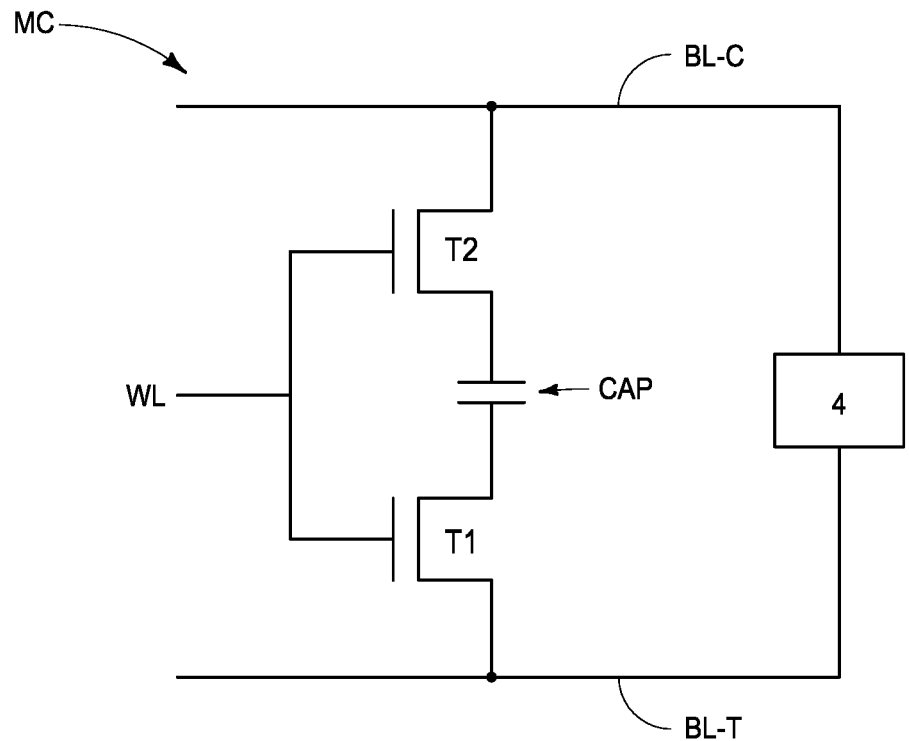
FIG. 1 is a non-structural diagrammatic schematic showing a 2T-1C memory cell.

Embodiments of the invention include a memory cell independent of method of manufacture. Embodiments of the invention also include methods of forming an array of two transistor-one capacitor (2T-1C) memory cells, and methods used in fabricating integrated circuitry. Although not everywhere so-limited, drawings are provided which depict method of fabrication and structure associated with a 2T-1C memory cell, for example as schematically shown in FIG. 1. An example 2T-1C memory cell MC has two transistors T1 and T2 and a capacitor CAP. A source/drain region of T1 connects with a first conductive node of capacitor CAP and the other source/drain region of T1 connects with a first comparative bit line (e.g., BL-T). A gate of T1 connects with a word line WL. A source/drain region of T2 connects with a second conductive node of capacitor CAP, and the other source/drain region of T2 connects with a second comparative bit line (e.g., BL-C). A gate of T2 connects with word line WL. Comparative bit lines BL-T and BL-C extend to circuitry 4 which compares electrical properties (e.g., voltage) of the two to ascertain a memory state of memory cell MC. The 2T-1C configuration of FIG. 1 may be used in DRAM and/or other types of memory.

Figure 2:
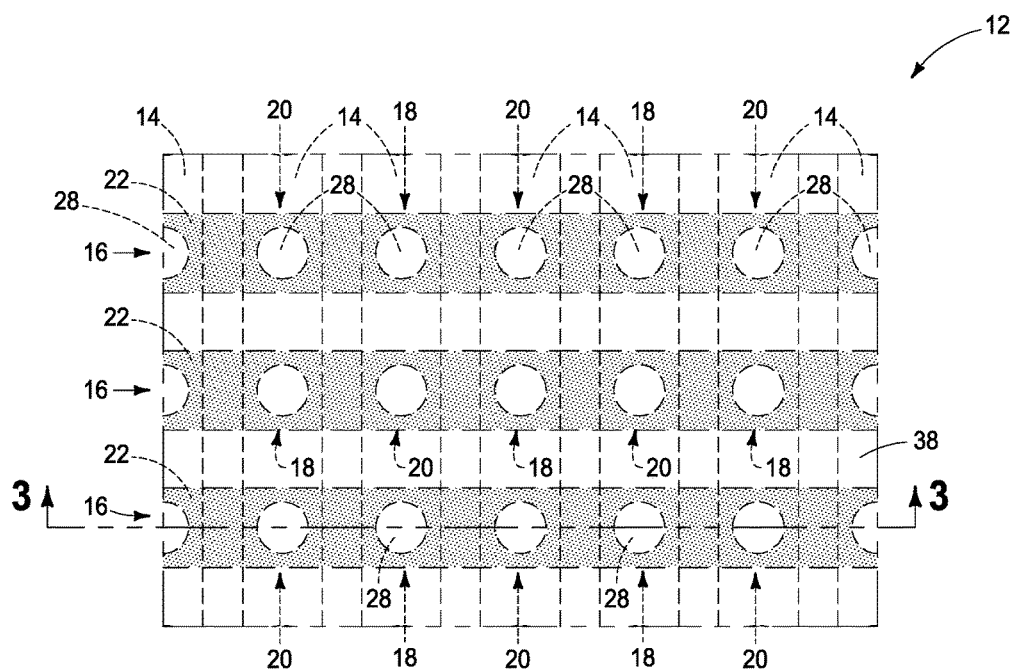
FIG. 2 is a diagrammatic top plan view of a construction comprising an array of 2T-1C memory cells in fabrication in accordance with an embodiment of the invention.
Figure 3:
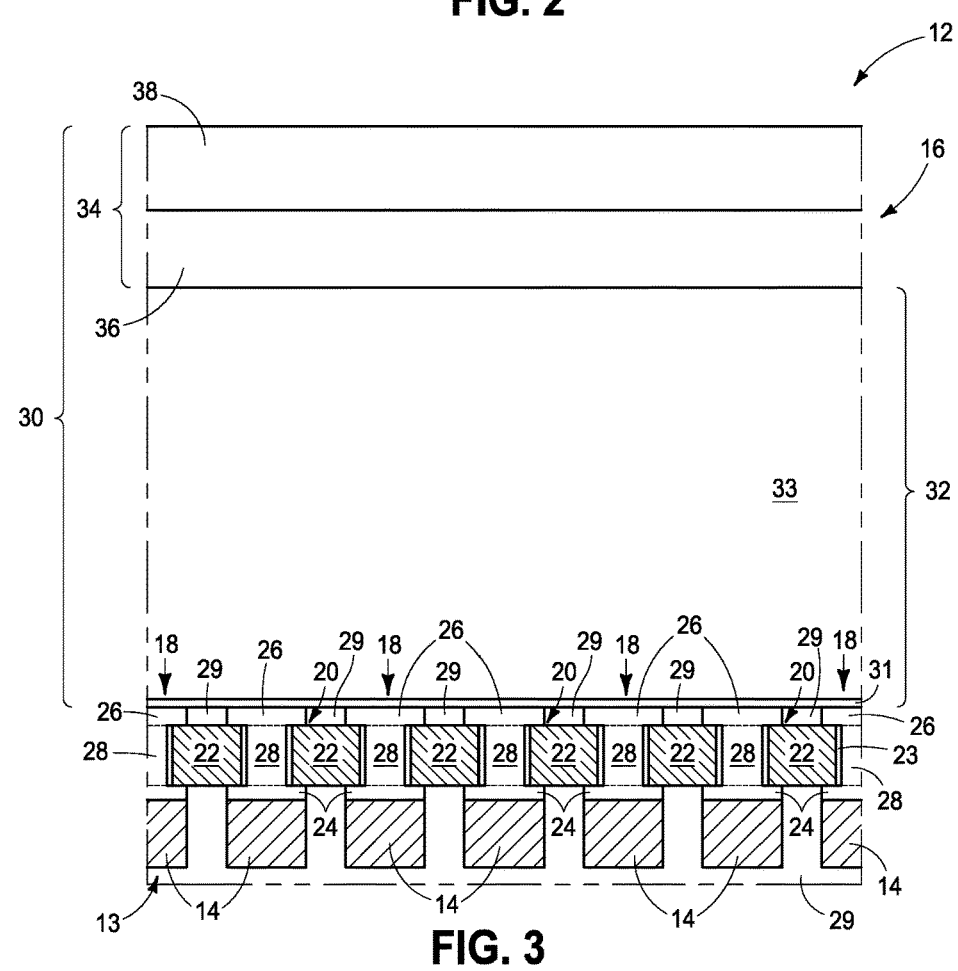
FIG. 3 is a cross-sectional view taken through line 3-3 in FIG. 2.

Example embodiments of methods of forming an array of 2T-1C memory cells MC are initially described with reference to FIGS. 2-21. Referring to FIGS. 2 and 3, such depict a portion of a substrate fragment of a construction 12 and within which multiple memory cells MC (not shown) will ultimately be fabricated. Materials may be aside, elevationally inward, or elevationally outward of the FIGS. 2 and 3-depicted materials. For example, other partially or wholly fabricated components of integrated circuitry may be provided somewhere about or within construction 12. Regardless, any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Construction 12 includes a base substrate 13 that may include any one or more of conductive/conductor/conducting (i.e., electrically herein), semiconductive, or insulative/insulating (i.e., electrically herein) materials. Construction 12 comprises rows 16 of first and second transistors 18 and 20, respectively. Any suitable transistors may be used, for example field effect transistors (with or without non-volatile programmable regions), bipolar junction transistors, etc. However, the discussion largely proceeds in fabrication of memory cells MC of the FIG. 1 schematic wherein example first and second transistors 18 and 20 are field effect transistors. Further, reference to "first" and "second" with respect to different components or materials herein is only for convenience of description in referring to different components, different materials, and/or same materials or components formed at different times. Accordingly, and unless otherwise indicated, "first" and "second" may be interchanged independent of relative position within the finished circuit construction and independent of sequence in fabrication. Construction 12 is shown as comprising dielectric material 29 (e.g., silicon nitride and/or doped or undoped silicon dioxide) about transistors 18, 20. In the top view of FIG. 2, only some underlying components are shown with dashed lines and that are pertinent to an example horizontal layout of such components. Also, the conductive material of access lines 22 of FIG. 3 (described below) is shown with stippling in FIG. 2 for better clarity in FIG. 2.

In one embodiment and as shown, first and second field effect transistors 18, 20 extend elevationally and alternate relative one another along individual rows 16 (i.e., they are intra-row-alternating). In this document, unless otherwise indicated, "elevational(ly)", "higher", "upper", "lower", "top", "atop", "bottom", "above", "below", "under", "beneath", "up", and "down" are generally with reference to the vertical direction. Further, "vertical" and "horizontal" as used herein are generally perpendicular directions relative one another independent of orientation of the substrate in three dimensional space. Also, "extend(ing) elevationally" and "elevationally-extending" encompasses a range from vertical to no more than 45° from vertical. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector. In one embodiment and as shown, the first and second intra-row-alternating transistors are each vertical or within 10° of vertical, and in one embodiment are in a common horizontal plane relative one another. In one embodiment and as shown, first and second transistors 18 and 20 are staggered in immediately adjacent rows (i.e., they are inter-row staggered).

Alternating field effect transistors 18, 20 individually comprise a first current node 26 (e.g., an elevationally outer source/drain region), a second current node 24 (e.g., an elevationally inner source/drain region), and a channel region 28 there-between. Access or word lines 22 extend along rows 16. First and second transistors 18, 20 comprise a gate that may be considered as comprising part of an individual access line 22 and which are shown optionally encircling individual channel regions 28. A suitable gate insulator 23 is between a gate/access line 22 and a channel region 28. Field effect transistors 18, 20 may be fabricated using any existing or yet-to-be-developed technique, and may have alternately configured size and shape source/drain regions, channel regions, gates, and/or gate insulators. Example regions 24, 26, and 28 may comprise suitably doped semiconductor material, and example conductive compositions for access lines 22 are one or more of elemental metal, a mixture or alloy of two or more elementals, conductive metal compounds, and conductively-doped semiconductive materials.

Construction 12 comprises columns of sense lines 14, with the rows of access lines 22 being above sense lines 14. Use of "row" and "column" in this document is for convenience in distinguishing one series or orientation of features from another series or orientation of features and along which components have been or will be formed. The rows may be straight and/or curved and/or parallel and/or not parallel relative one another, as may be the columns. Further, the rows and columns may intersect relative one another at 90° or at one or more other angles. Sense lines 14 may be of any suitable conductive composition which may be the same or different from that of access lines 22. Within an individual row, immediately adjacent pairs of sense lines 14 may be BL-T and BL-C (and thereby be intra-row alternating) in the FIG. 1 schematic. Further, the same sense lines in an immediately adjacent row may be BL-C and BL-T, respectively (and thereby be inter-row alternating in operation).

Elevationally inner source/drain regions 24 of alternating field effect transistors 18, 20 are electrically coupled (in one embodiment, directly electrically coupled) to an individual sense line 14. In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/ components are referred to as being "directly electrically coupled", no intervening electronic component (e.g., no diode, transistor, resistor, transducer, switch, fuse, etc.) is between the directly electrically coupled regions/materials/components. In one embodiment, elevationally inner source/drain regions 24 are directly above an individual sense line 14. In this document, "directly above" requires at least some lateral overlap (i.e., horizontally) of two stated regions/materials/components relative one another. Further, use of "above" not preceded by "directly" only requires that some portion of the stated region/material/component that is above the other be elevationally outward of the other (i.e., independent of whether there is any lateral overlap of the two stated regions/materials/components).

Material 30 is elevationally outward of transistors 18, 20. In one embodiment, such comprises an elevationally inner dielectric material 32 (e.g., silicon nitride 31 and doped or undoped silicon dioxide 33) and an elevationally outer material 34. In one embodiment and as shown, material 34 comprises an elevationally inner material 36 and an elevationally outer material 38 of different composition from that of material 36 (e.g., silicon nitride for material 36, carbon for material 38.

Figure 4:
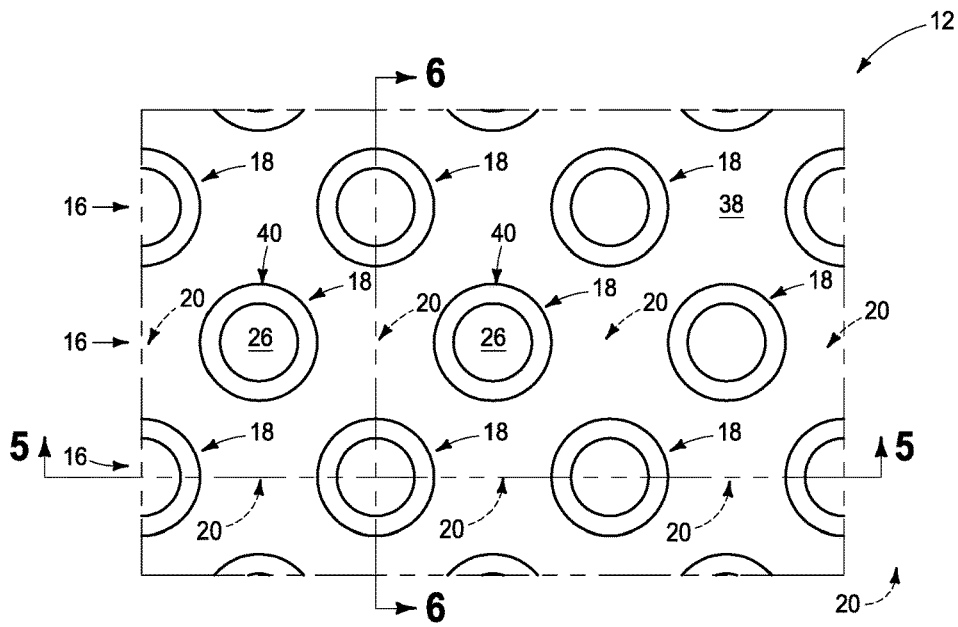
FIG. 4 is a view of the FIG. 2 construction at a processing step subsequent to that shown by FIG. 2.
Figure 5:
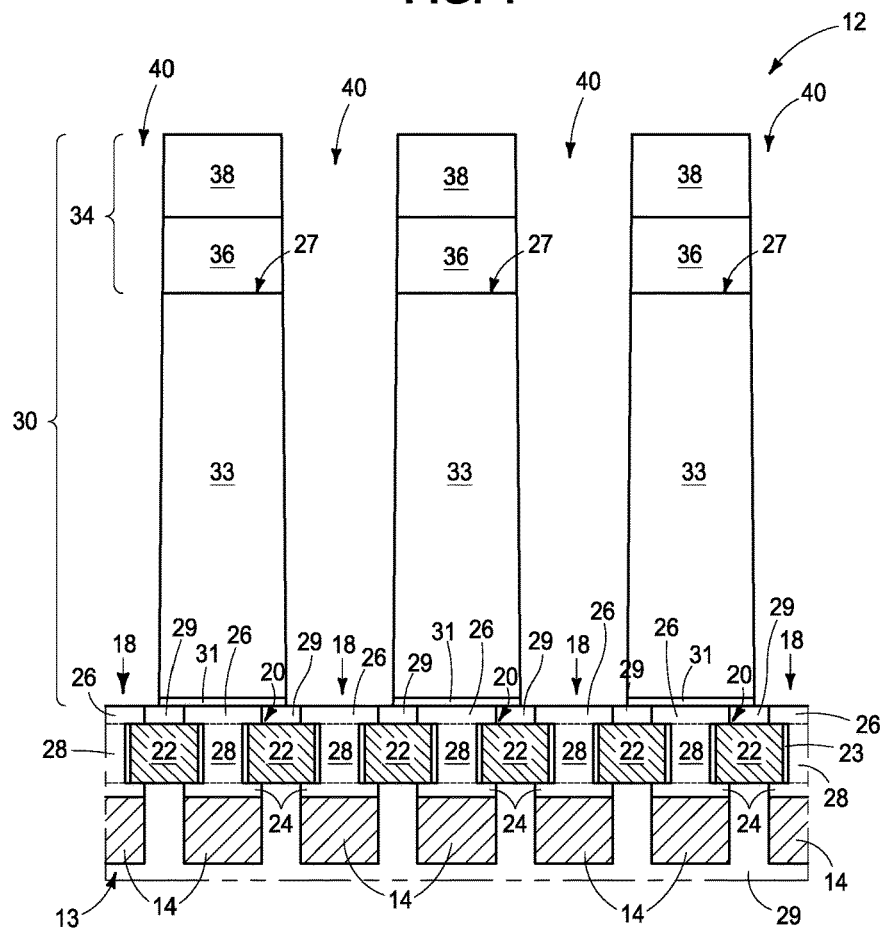
FIG. 5 is a cross-sectional view taken through line 5-5 in FIG. 4.
Figure 6:
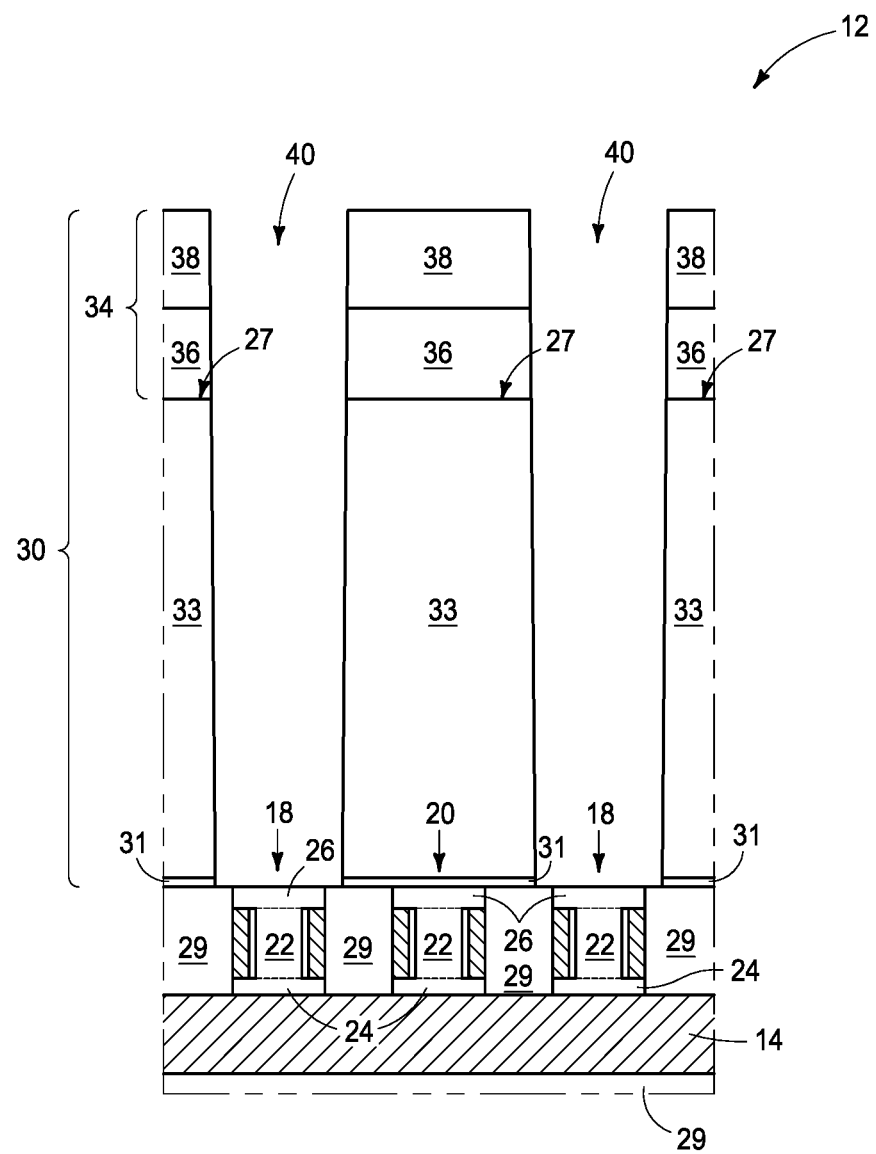
FIG. 6 is a cross-sectional view taken through line 6-6 in FIG. 4.

Referring to FIGS. 4-6, a plurality of openings 40 (in one embodiment capacitor openings) has been formed in material 30 and that individually extend to a first current node 26 of individual first transistors 18. Rings of material 29 would be about nodes 26 but are not shown in FIG. 4 for clarity in FIG. 4. In one embodiment and as shown, openings 40 are staggered in immediately adjacent rows (i.e., they are inter-row staggered). Example techniques for forming openings 40 include photolithographic patterning and etch, and may include pitch multiplication. In one embodiment, openings 40 immediately adjacent tops 27 of material 33 have a minimum horizontal open dimension of 1.5F, where "F" is the greatest horizontal dimension of an elevationally outermost surface of an individual first current node 26.

Figure 7:
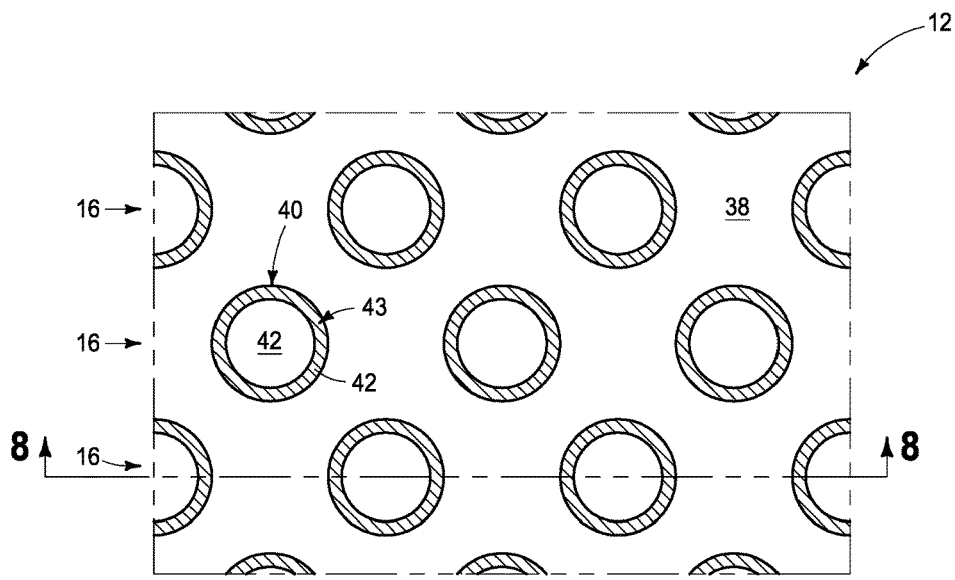
FIG. 7 is a view of the FIG. 4 construction at a processing step subsequent to that shown by FIG. 4.
Figure 8:
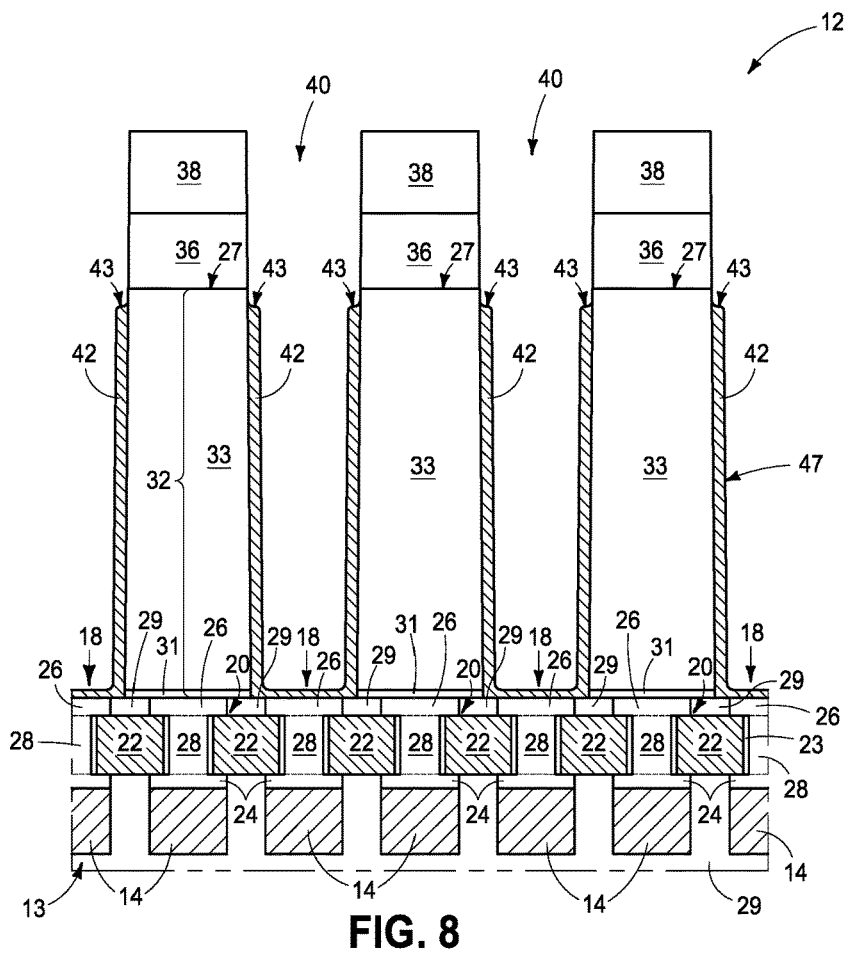
FIG. 8 is a cross-sectional view taken through line 8-8 in FIG. 7.

Referring to FIGS. 7 and 8, a conductive material has been deposited to line and less-than-fill openings 40, and then in one embodiment etched back to have its tops 43 be below a top 27 of inner dielectric material 32, thus forming a first capacitor node 42. In one embodiment and as shown, first capacitor node 42 is of a container-shape. Regardless, in one embodiment and as shown, first capacitor node 42 is electrically-coupled (in one embodiment directly electrically coupled) to first current node 26 of individual first transistors 18, and in one embodiment is directly against an upper surface of first current node 26. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another. In one embodiment and as shown, first capacitor node 42 is directly above first current node 26 of first transistor 18, and in one embodiment container-shape first capacitor node 42 and first transistor 18 are longitudinally coaxial (e.g., along a common vertical axis in the depicted embodiment). Any suitable conductive composition may be used for first capacitor node 42, and which may be the same or different from that of one or both of access lines 22 and sense lines 14. Example first capacitor node 42 may be formed by initial deposition of conductive material to a thickness considerably greater than shown, followed by isotropic or anisotropic etch-back to leave a base of node 42 over first current nodes 26. Alternately, the conductive material deposition may be to roughly its final thickness, followed by plugging the opening with sacrificial material, then etch-back, and then removal of the sacrificial material.

Figure 9:
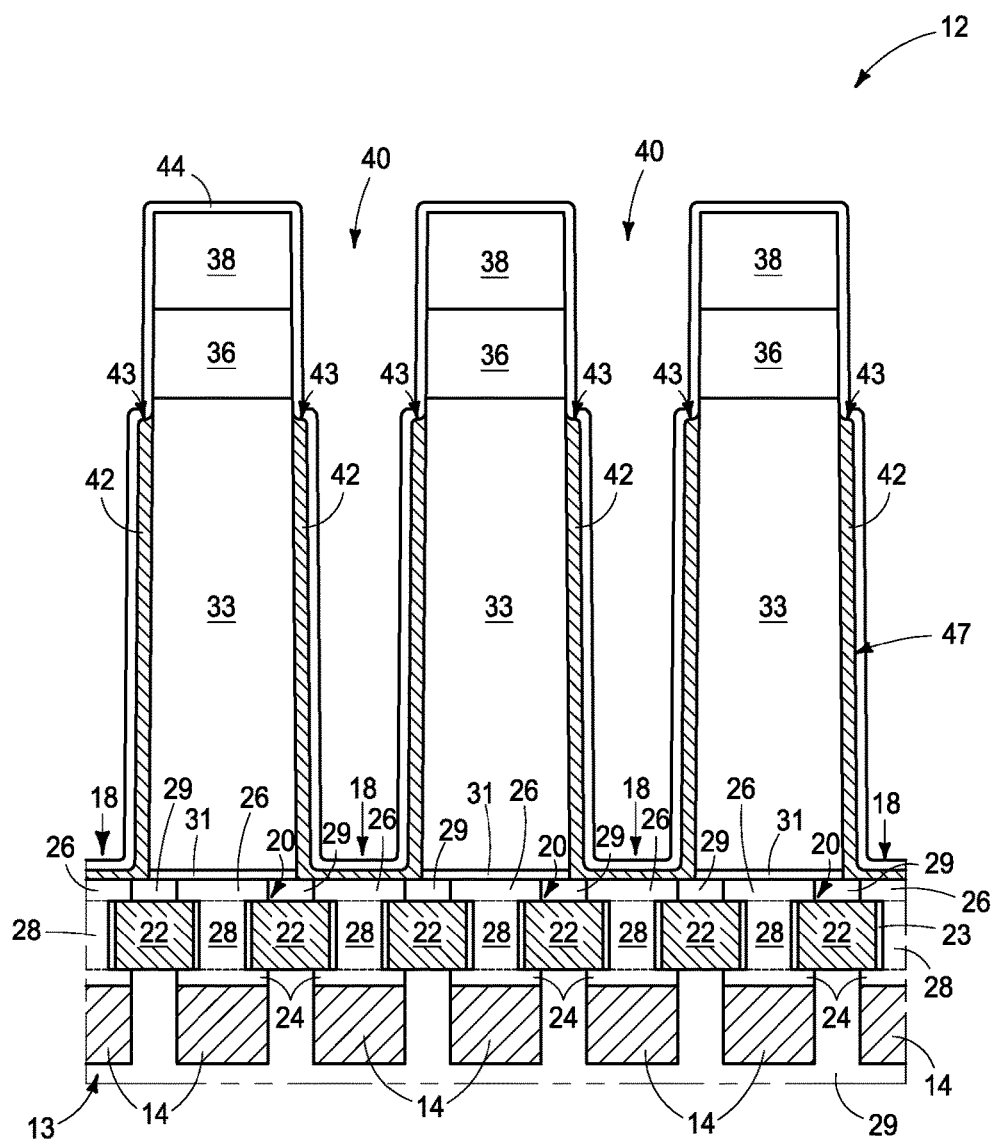
FIG. 9 is a view of the FIG. 8 construction at a processing step subsequent to that shown by FIG. 8.

Referring to FIG. 9, capacitor dielectric 44 has been deposited to line and less-than-fill remaining volume of openings 40. In one embodiment and as shown, capacitor dielectric material 44 extends across top 43 of container-shape first capacitor node 42, and in one embodiment is directly against top 43. Example materials for capacitor dielectric 44 are non-ferroelectrics such as any one or more of silicon dioxide, silicon nitride, aluminum oxide, hafnium oxide, zirconium oxide, etc. Alternately, such may comprise ferroelectric material such as any one or more of a transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element.

Figure 10:
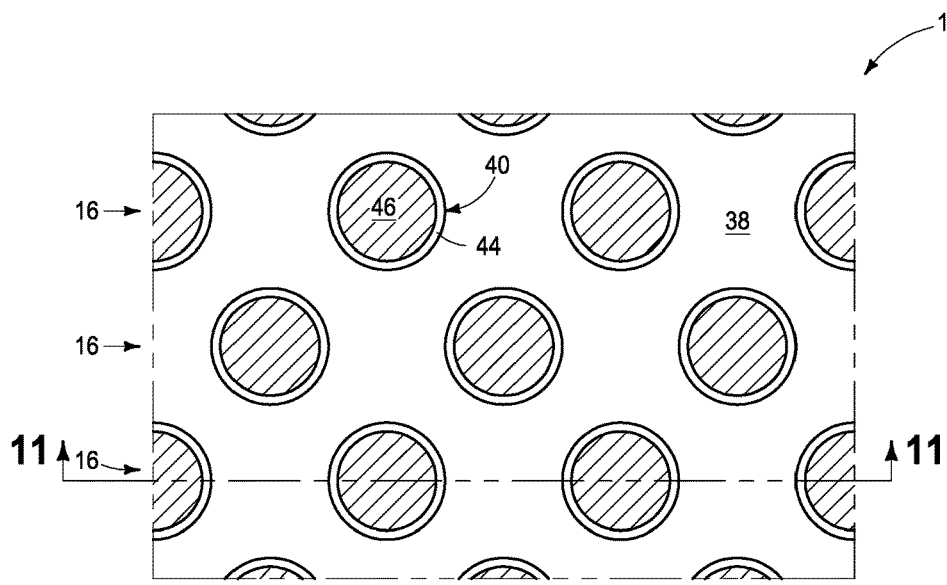
FIG. 10 is a top plan view of the FIG. 9 construction at a processing step subsequent to that shown by FIG. 9.
Figure 11:
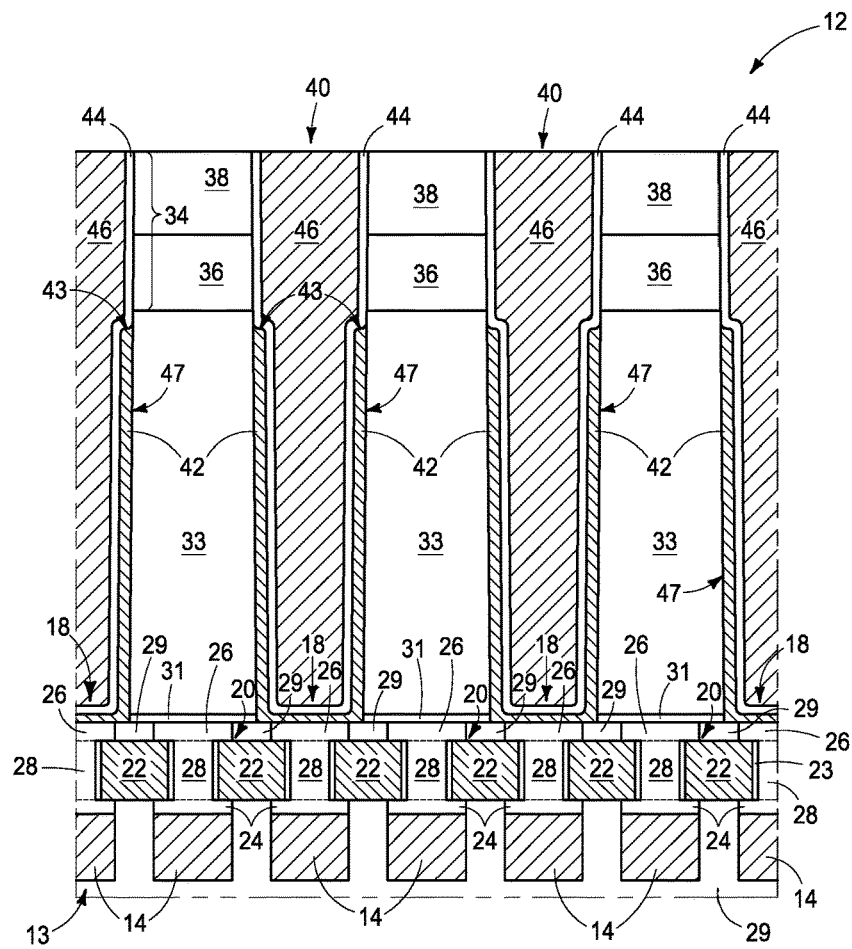
FIG. 11 is a cross-sectional view taken through line 11-11 in FIG. 10.

Referring to FIGS. 10 and 11, conductive material has been deposited over capacitor dielectric 44, followed by planarizing it and capacitor dielectric material 44 back at least to a top of material 34, thus forming a conductive second capacitor node 46. The conductive materials of capacitor nodes 46 and 42 may be the same or different composition(s) relative one another. Regardless, features 42, 44, and 46 form a pillar 47, in one embodiment and as shown a capacitor pillar, in individual openings 40.

Figure 12:
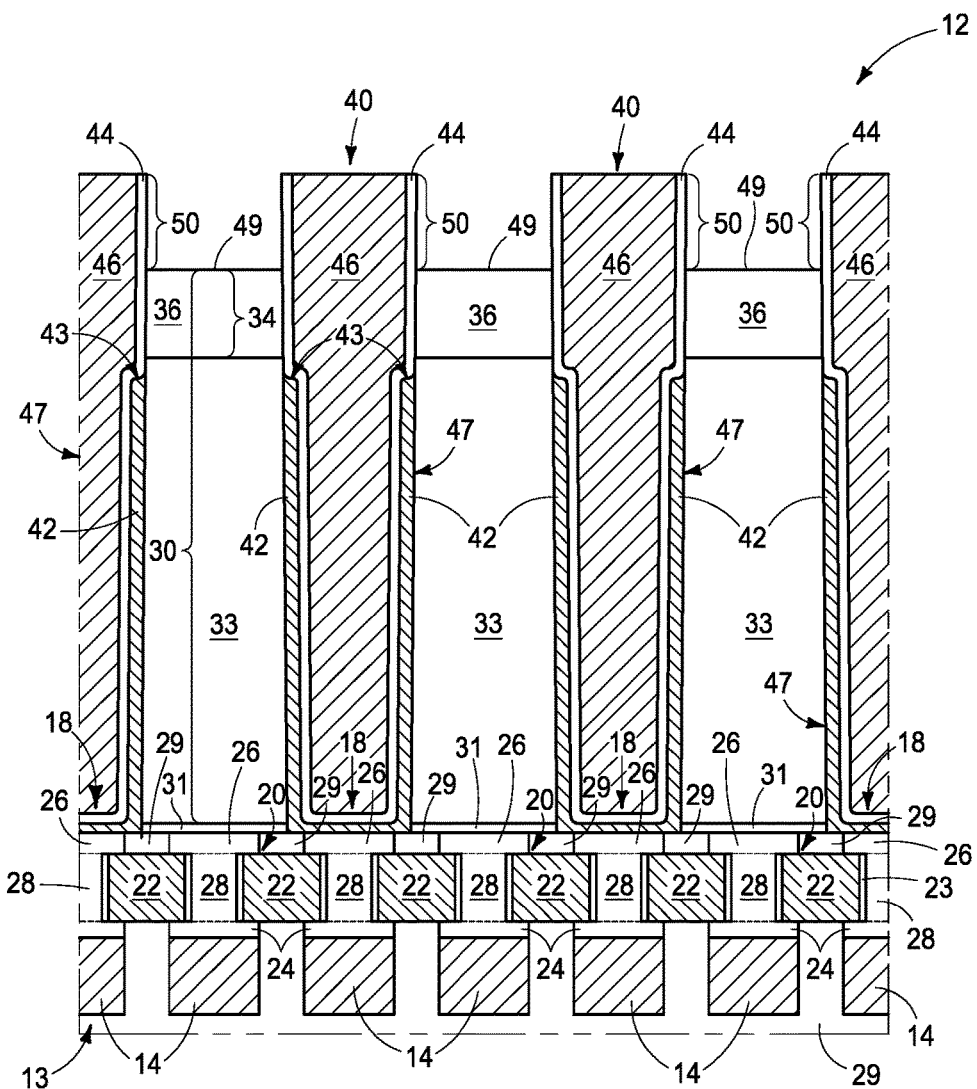
FIG. 12 is a view of the FIG. 11 construction at a processing step subsequent to that shown by FIG. 11.

Referring to FIG. 12, material 30 in which openings 40 were formed has been recessed to result in uppermost portions 50 of pillars 47 projecting elevationally outward relative to an upper surface 49 of material 30, thus the elevationally outermost portion of material 30 in FIG. 3 being sacrificial. In one embodiment and as shown, at least some of material 34 has been removed elevationally inward to form upper surfaces 49 relative to which the pillars project elevationally outward, and in one embodiment as shown comprises etching away all of elevationally outer material 38 (not shown) selectively relative to elevationally inner material 36. In this document, a selective etch or removal is an etch or removal where one material is removed relative to another stated material at a rate of at least 2:1. Alternately by way of example only, only a single composition material (not shown) may be used (i.e., no different composition layers 36 and 38), for example with etching back to produce a construction analogous to that shown in FIG. 12 being conducted by a timed etch of material 34 without separate etch-stop material 36.

Figure 13:
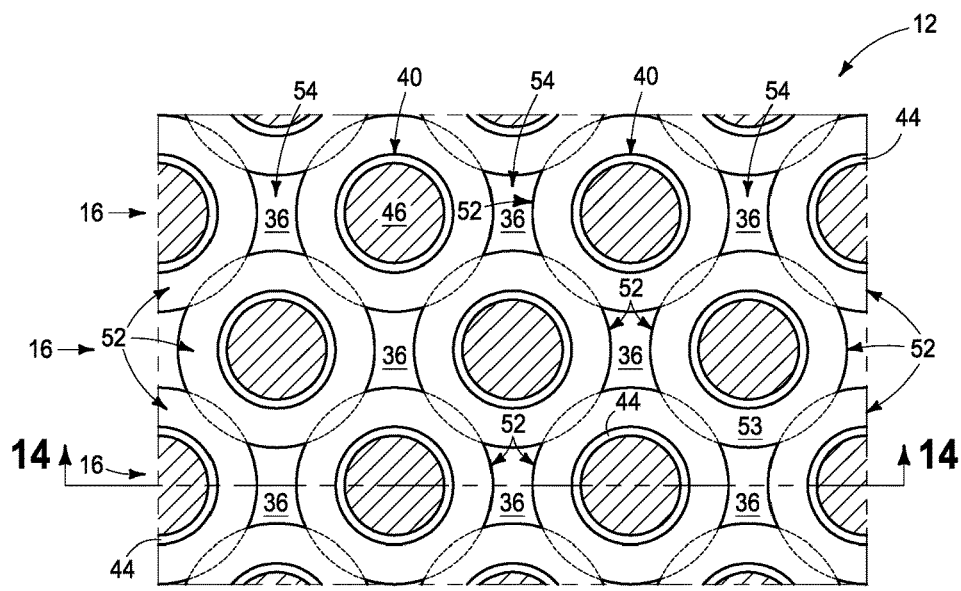
FIG. 13 is a top plan view of the FIG. 12 construction at a processing step subsequent to that shown by FIG. 12.
Figure 14:
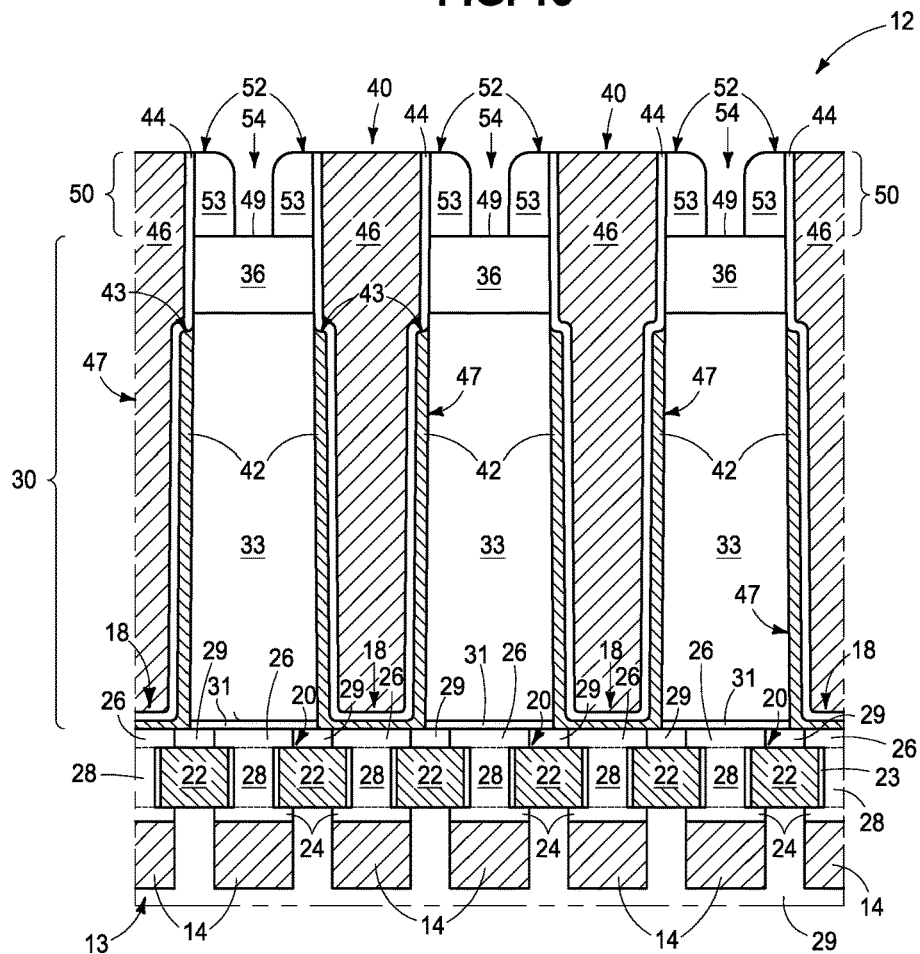
FIG. 14 is a cross-sectional view taken through line 14-14 in FIG. 13.
Figure 15:
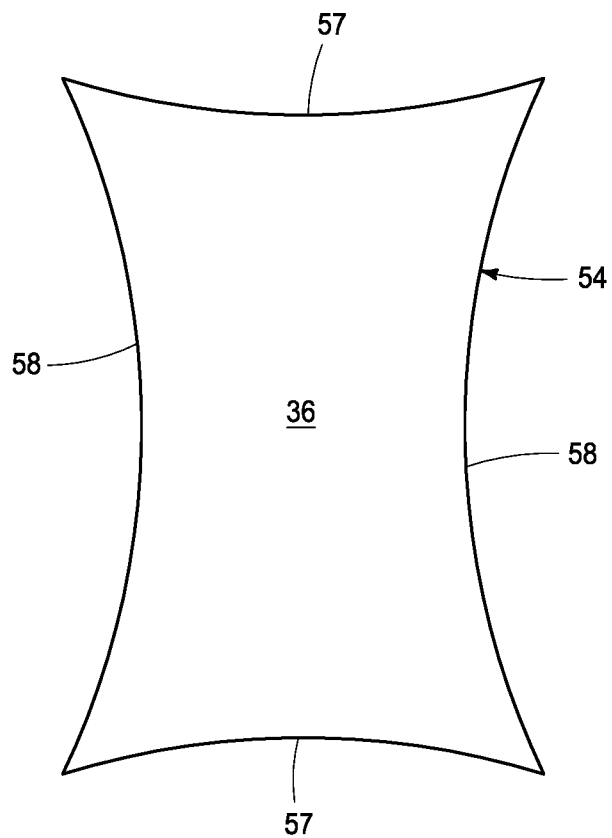
FIG. 15 is an enlarged view of a portion of FIG. 14.

Referring to FIGS. 13-15, a ring 52 of masking material 53 has been formed circumferentially about projecting portions 50 of individual pillars 47. Rings 52 form individual mask openings 54 defined by four immediately-surrounding rings 52 in immediately-adjacent rows 16. Mask openings 54 are intra-row-staggered with and between immediately-intra-row-adjacent openings 40. Material 53 of rings 52 may be entirely sacrificial and, accordingly, may comprise any conductive, insulative, and/or semiconductive material(s). Rings 52 may be formed, by way of ideal example, by deposition of material 53 to a lateral thickness which is less than F (e.g., one-half F thickness being shown), followed by maskless anisotropic spacer-like etching thereof whereby openings 54 are sub-F and/or sub-lithographic in maximum and/or minimum lateral dimensions in vertical cross-section. Openings 54 may be sub-F and/or sub-lithographic in maximum length. In one embodiment and as perhaps best shown in the enlarged view of FIG. 15, at least at an elevationally outer portion of individual mask openings 54 are of an hourglass shape in horizontal cross-section. In this document, an "hourglass shape" requires opposing longitudinal ends of the shape to each be wider (regardless of whether the same width) than a central portion of the shape. The example depicted hourglass shape of mask openings 54 may be considered as comprising longitudinally-extending side surfaces 58 and laterally-extending end surfaces 57 (FIG. 15). In one embodiment and as shown, laterally-extending outermost end surfaces 57 of the hourglass shape are circularly concave. In one embodiment and as shown, longitudinally-extending outermost surfaces 58 of the hourglass shape are circularly concave between longitudinal ends (e.g., surfaces 57) of the hourglass shape.

Figure 16:
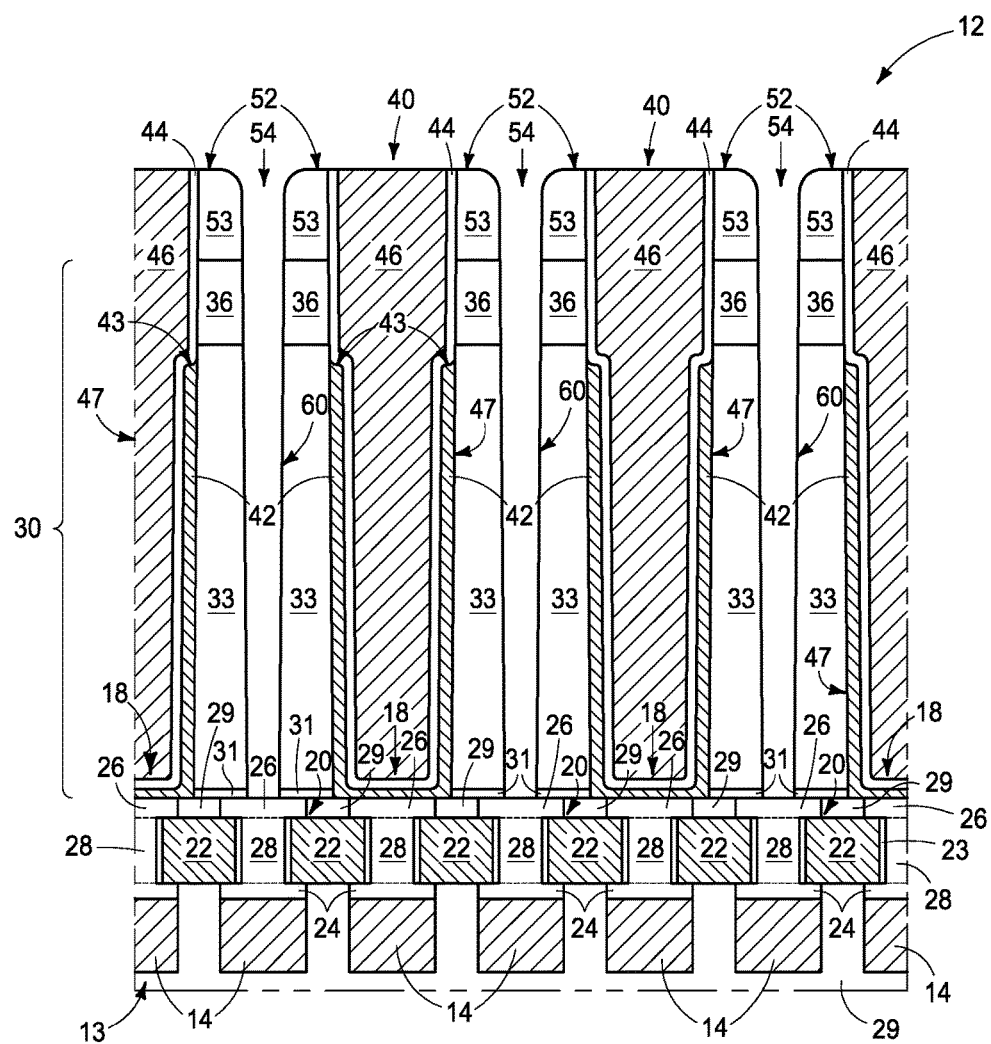
FIG. 16 is a view of the FIG. 14 construction at a processing step subsequent to that shown by FIG. 14.

Referring to FIG. 16, rings 52 and pillars 47 have been used as a mask while etching material 30 through mask openings 54 to form individual via openings 60 to individual first current nodes 26 of individual second transistors 20. Such may be conducted using any suitable anisotropic etching chemistry or chemistries and techniques, whether existing or yet-to-be-developed. If individual mask openings 54 are of an hourglass shape in horizontal cross-section, that shape may transfer wholly, partially, or not at all to the bottom of via openings 60.

Figure 17:
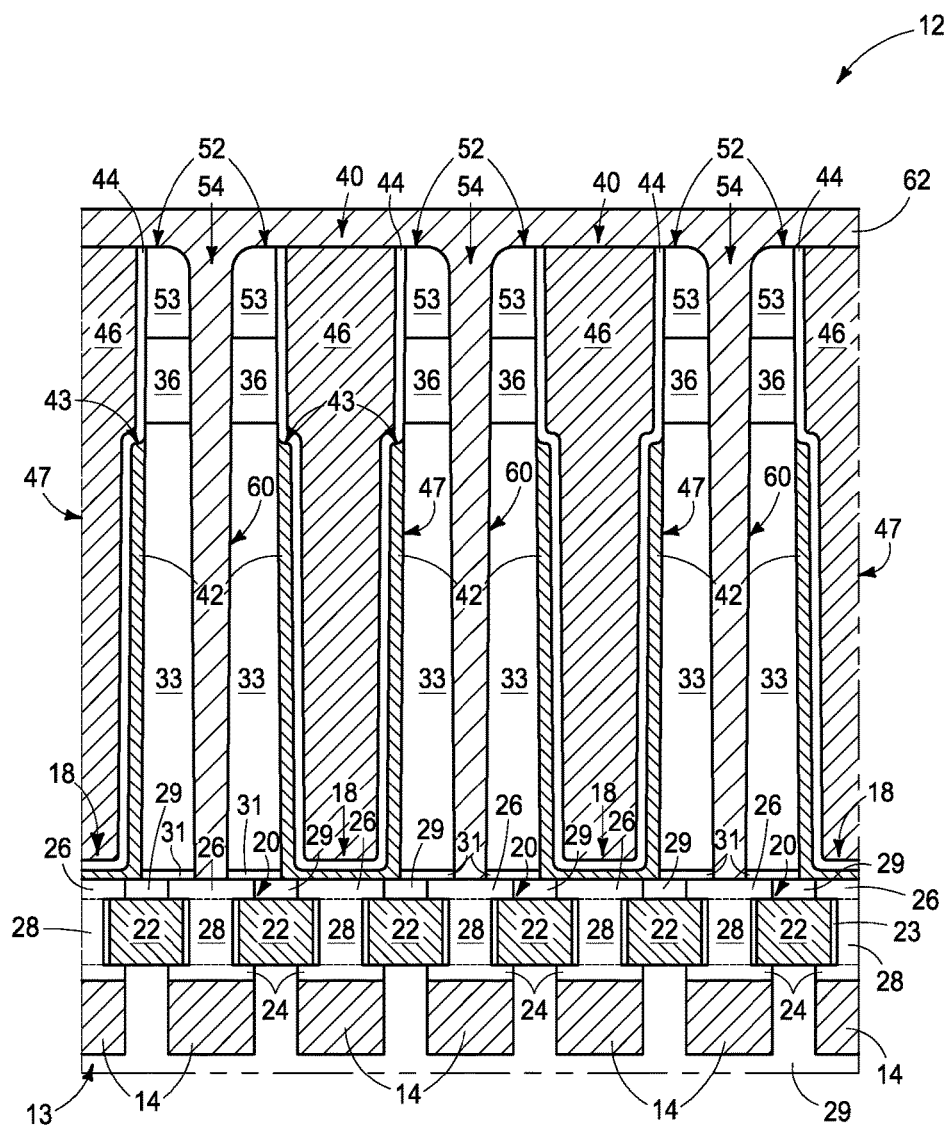
FIG. 17 is a view of the FIG. 16 construction at a processing step subsequent to that shown by FIG. 16.

Referring to FIG. 17, conductive material 62 has been formed in individual via openings 60 to electrically couple (in one embodiment, directly electrically couple) with first current nodes 26 of second transistors 20. Conductive material 62 may be of the same or different composition(s) as that of capacitor nodes 42 and/or 46. In one embodiment and as shown, conductive material 62 is deposited to overfill via openings 60 and be elevationally outward of rings 52 and pillars 47.

Figure 18:
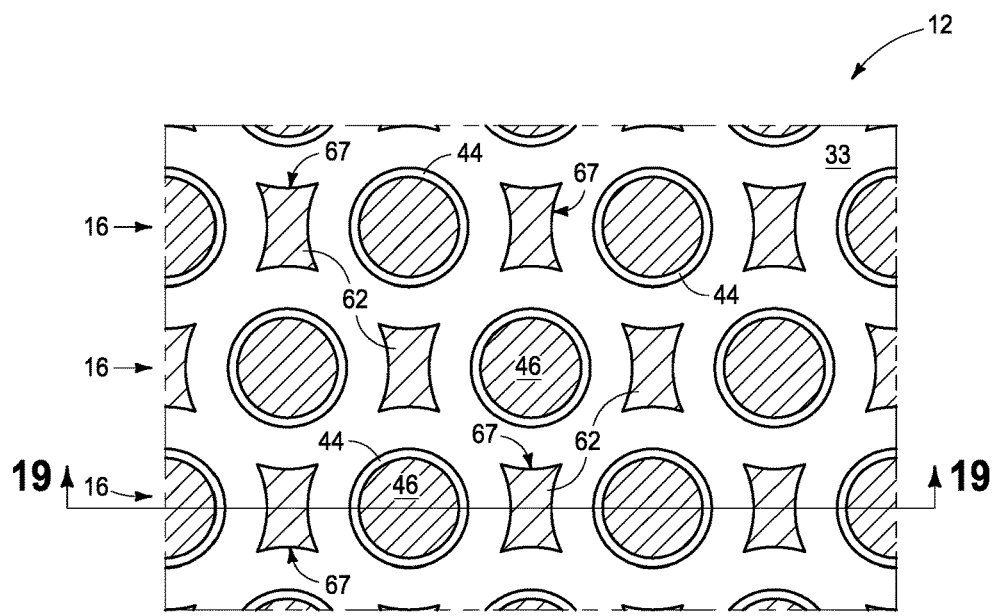
FIG. 18 is a top plan view of the FIG. 17 construction at a processing step subsequent to that shown by FIG. 17.
Figure 19:
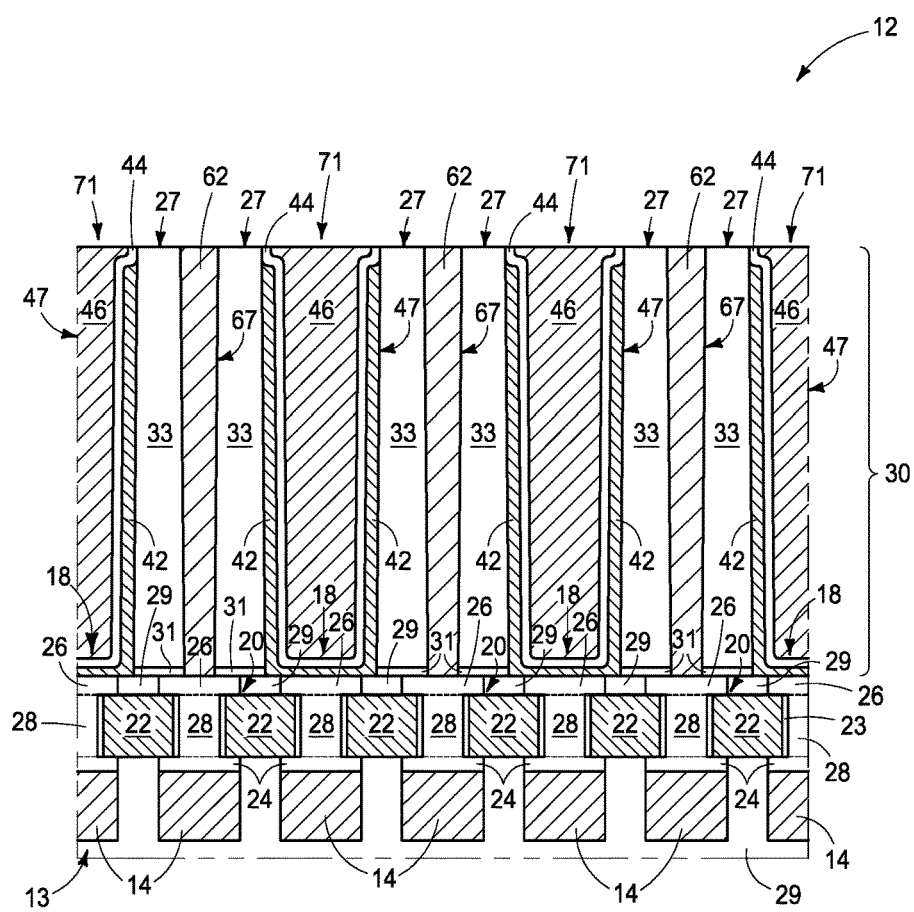
FIG. 19 is a cross-sectional view taken through line 19-19 in FIG. 18.

Referring to FIGS. 18 and 19, projecting portions 50 (not shown) of capacitor pillars 47 and rings 52 (not shown) have been removed from being above material 30 (and material 33), thus forming pillars 67 of conductive material 62 and capacitors 71 comprising dielectric 44 and capacitor nodes 42 and 46. Such may occur by any existing or yet-to-be-developed technique, such as etching, resist etch-back, or chemical mechanical polishing. In one embodiment and as shown, such removal has been sufficient to remove material 36 (not shown) completely from the substrate, for example back at least to top 27 of dielectric material 33. In one embodiment and as shown, at least most (i.e., more than half up to and including all) of the removing of projecting portions 50 (not shown) and rings 52 (not shown) occurs after forming conductive material 62 within via opening 60. In one embodiment, conductive pillars 67 have an elevationally outer portion that is of hourglass shape in horizontal cross-section. In such embodiment, conductive pillars 67 may have their entire elevational thicknesses in respective horizontal cross-sections of an hourglass shape, or may have elevationally inner portions thereof not of such shape.

Figure 20:
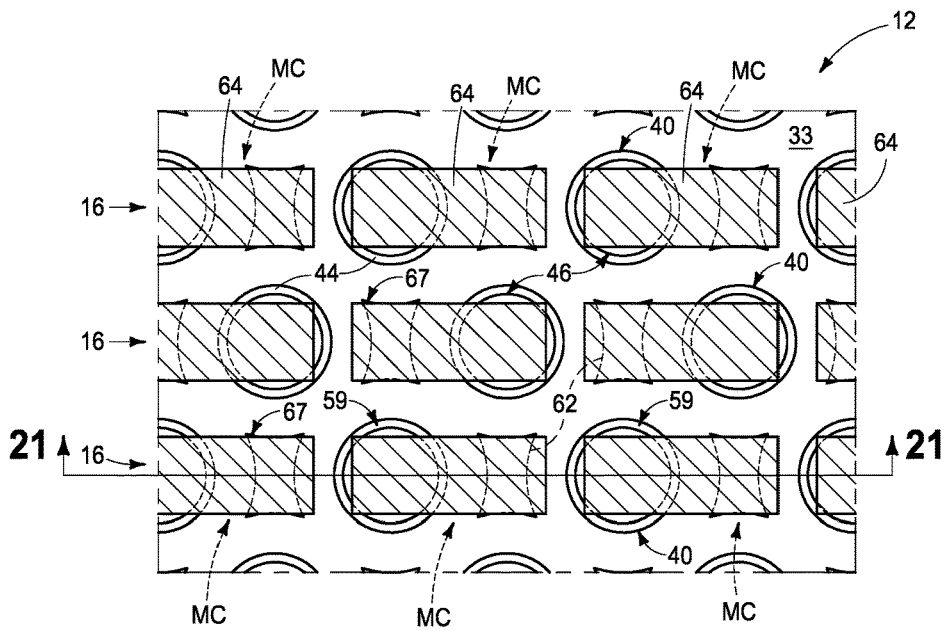
FIG. 20 is a view of the FIG. 18 construction at a processing step subsequent to that shown by FIG. 18.
Figure 21:
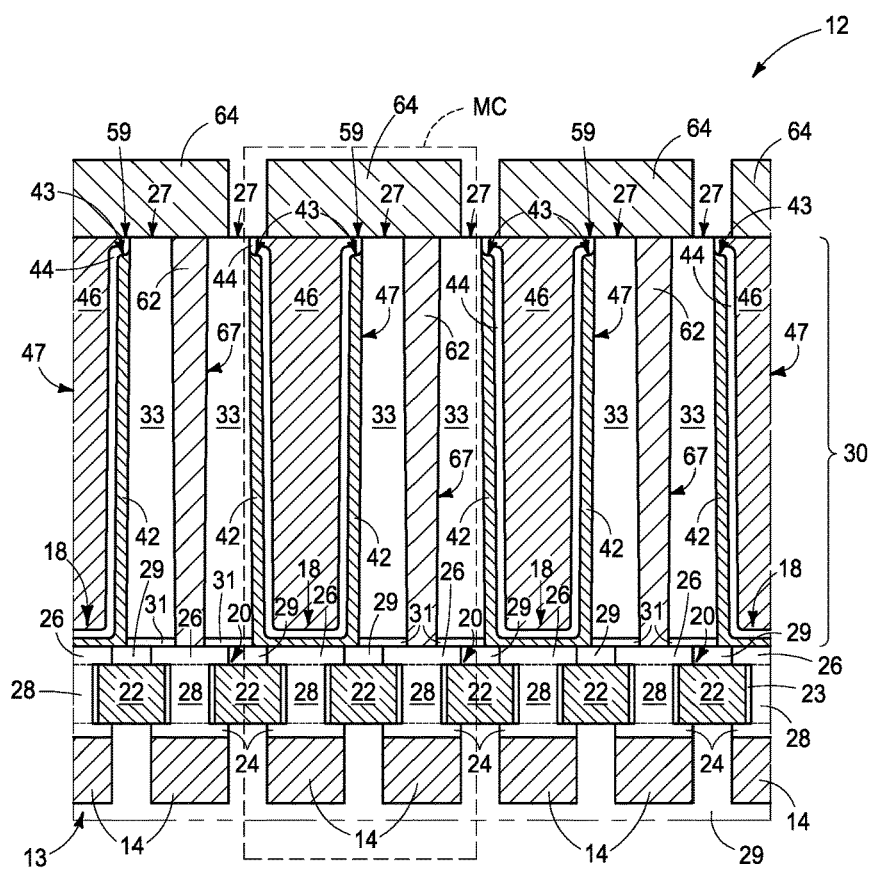
FIG. 21 is a cross-sectional view taken through line 21-21 in FIG. 20.

Referring to FIGS. 20 and 21, conductive material 64 has been deposited and patterned to electrically couple (in one embodiment directly electrically couple) conductive material 62 in individual via openings 60 with one of four immediately-surrounding capacitor pillars 47, thus forming an individual 2T-1C memory cells MC (only one outline MC being shown in FIG. 21 for clarity). Such may be formed by subtractive patterning and etch with or without pitch multiplication, damascene processing with or without pitch multiplication, etc. Regardless and in one embodiment, the above example processing shows conducting the forming of conductive material 62 in via openings 60 and the electrically coupling of those via openings to one of the four immediately-surrounding capacitor pillars 47 in two separate time-spaced conductive material-deposition steps. Conductive material 64 may be of the same or different composition(s) relative to conductive material 62 and the conductive materials of capacitor nodes 42 and/or 46. FIGS. 20 and 21 show conductive material 64 electrically coupling conductive material 62 of individual pillars 67 with the capacitor pillar 47 that is immediately to the left, although in some embodiments such might alternately electrically couple with any one of the other three.

Conductive materials 62 and 64 effectively constitute a part of second capacitor node 46 (and accordingly capacitor 71) the result of such materials being directly electrically coupled relative one another (e.g., conductive material 64 being directly against conductive material of capacitor nodes 46 within openings 40, and conductive material 62 being directly against conductive material 64). Accordingly and in one embodiment, second capacitor node 46/64/62 is directly against a top 59 of capacitor dielectric material 44. Regardless, and in one embodiment as shown, second capacitor node 46/64/62 is directly above first current node 26 of second transistor 20 and in one embodiment is also directly above first current node 26 of first transistor 18. In one embodiment and as shown, first capacitor node 42 is directly electrically coupled with first current node 26 of first transistor 18 and second capacitor node 46 is directly electrically coupled with first current node 26 of second transistor 20. In one embodiment and as shown, pillars 67 formed of material 62 and second transistor 20 are longitudinally coaxial.

Embodiments of the invention encompass methods independent of forming an array of 2T-1C memory cells, independent of forming memory cells, and independent of forming capacitors. For example, an embodiment of the invention encompasses a method of forming a plurality of rows (e.g., 16) of pillar openings (e.g., 40) that are inter-row staggered (e.g., FIG. 4, and regardless of whether those openings will contain a capacitor or other component of a memory cell or of integrated circuitry). A pillar is formed in individual of the pillar openings (e.g., 47, and independent of whether such comprises a material of a capacitor or other operative circuit component that remains as part of the finished circuitry construction). The pillars are formed to project elevationally outward relative to an upper surface of material in which the pillar openings were formed (e.g., FIG. 12, and independent of technique by which the pillars are formed to be so-projecting). A ring of masking material (e.g., 52 of material 53) is formed circumferentially about the individual pillars. The rings form individual mask openings (e.g., 54) defined by four immediately-surrounding of the rings that are in immediately-adjacent of the rows, with the rings being intra-row-staggered with and between immediately-adjacent of the pillar openings. The rings and pillars are used as a mask while etching the material in which the pillar openings were formed through the mask openings (e.g., FIG. 16) to form individual via openings (e.g., 60) that are intra-row-staggered with and between immediately-adjacent of the pillar openings. Conductive material (e.g., 62) is formed in the via openings electrically coupled (e.g., by material 64, and in one embodiment directly electrically coupled) with an operative circuit component (e.g., 71, and independent of whether that circuit component is a capacitor) formed in one of four of the pillar openings that immediately-surround the individual via openings.

In one embodiment, the operative circuit component comprises a capacitor, and the pillar is formed to comprise conductive material (e.g., material of capacitor node 46) and capacitor dielectric material (e.g., 44) of the capacitor and that remains as part of the finished circuitry construction. Portions of the pillars that project elevationally outward comprise the conductive material and the capacitor dielectric. In one embodiment, the capacitor comprises two conductive nodes separated by the capacitor dielectric and the conductive material of only one of the conductive nodes projects elevationally outward relative to the upper surface of the material in which the pillar openings were formed (e.g., materials 46 and 44 as shown in FIG. 12 projecting relative to surface 49).

Figure 22:
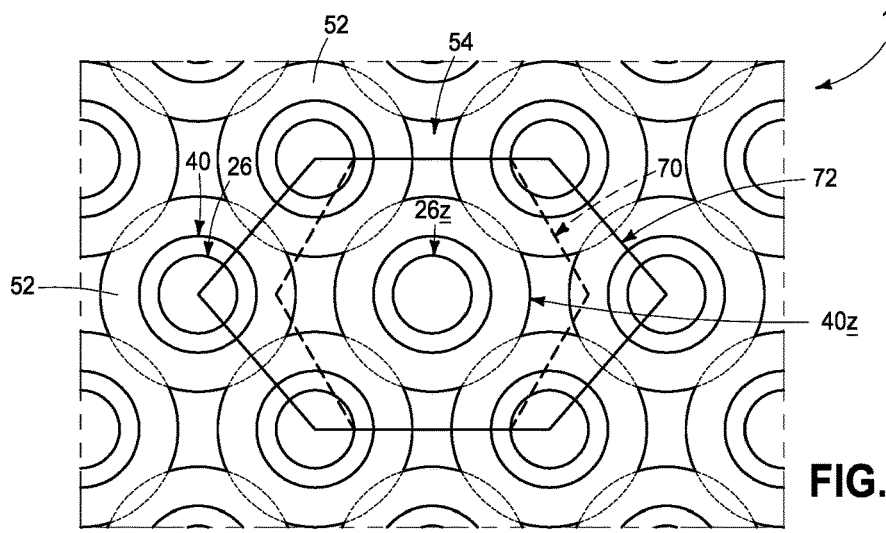
FIGS. 22, 23, and 24 are diagrammatic top plan views of arrays in accordance with embodiments of the invention.

FIG. 22 is a diagrammatic representation of construction 10 somewhat like FIG. 13 (i.e., identical arrangement and scale) showing pillar openings 40, rings 52, mask openings 54, and also showing outlines of source/drain regions 26 but not showing conductive material of capacitor electrode 46. Consider a theoretical normal hexagon 70 (i.e., congruent sides and congruent internal angles) as would exist if the idealized circles forming openings 40 were centered at the apexes of regular hexagon 70, which would form a theoretical 2D hexagonal close packed (HCP) array of such openings. Consider in the depicted actual example embodiment construction a non-regular hexagon 72 having concentric circles 40/26 centered at the apexes of such hexagon. Both hexagon 70 and hexagon 72 are shown centered about a center circle 40z/26z. As may be apparent and in one embodiment, hexagon 72 may be considered as resulting from stretching hexagon 70 in the "x" direction, but not stretched or shrunk in the "y" direction. Rings 52 are diagrammatically shown as individually having a circular periphery that overlaps with immediately-diagonally-adjacent rings 52. Accordingly and in one embodiment, such rings 52 are not tangent relative one another and regardless of whether the rings form circles.

Figure 23:
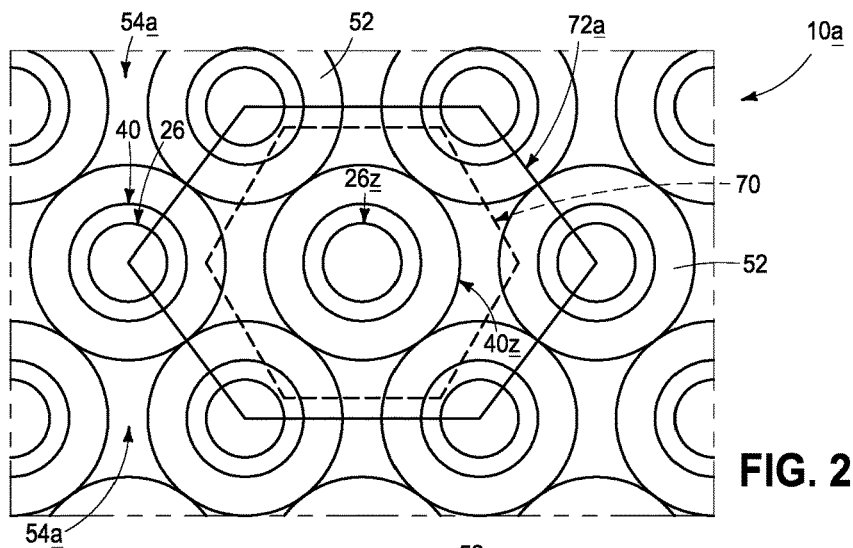

FIG. 23 shows an alternate embodiment construction 10*a* where immediately-diagonally-adjacent rings 52 are tangent relative one another. Like numerals from the above-described embodiments have been used where appropriate, with some construction differences being indicated shown with the suffix "a". In construction 10*a*, hexagon 72*a* has been expanded in both "x" and "y" directions relative to hexagon 70 such that immediately-diagonally-adjacent rings 52 are tangent relative one another.

Figure 24:
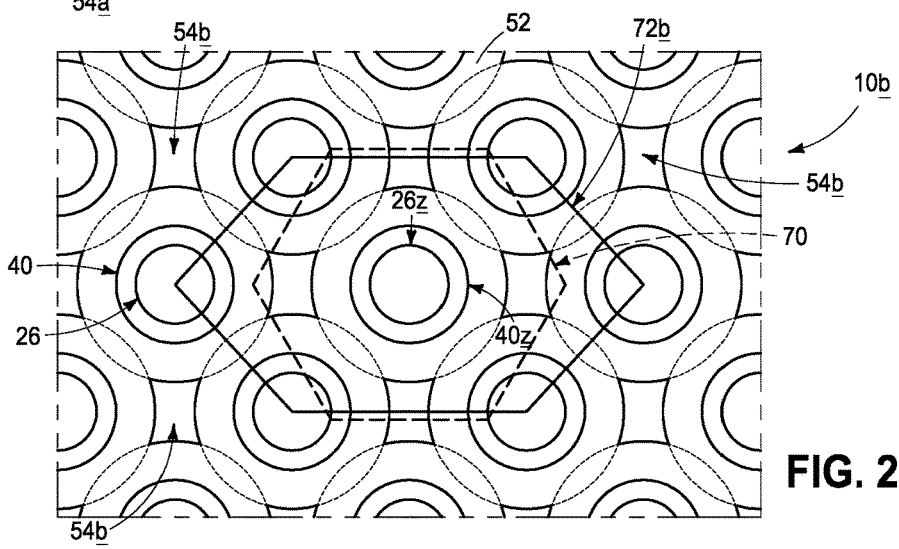

FIG. 24 shows an alternate embodiment construction 10*b* where immediately-diagonally-adjacent rings 52 are not tangent relative one another, and hexagon 72*b* is different in both "x" and "y" directions relative hexagon 70 (e.g., stretched in "x" and shrunk in "y"). Like numerals from the above-described embodiments have been used where appropriate, with some construction differences being shown with the suffix "b"

As is apparent from FIGS. 22-24, mask openings 54/54*a*/54*b* have different longitudinal lengths and different degrees of "hourglass" (i.e., greater width[s] of the longitudinal ends relative to the middle meaning greater degree of "hourglass").

In one embodiment and as shown, pillar openings 40 are arrayed in a 2D centered rectangular Bravais lattice.

Embodiments of the invention encompass memory cells independent of the method of manufacture. Nevertheless any of such memory cells may have any of the attributes as described above with respect to structure in the method embodiments. In one embodiment, a memory cell (e.g., MC) comprises first and second transistors laterally displaced relative one another (e.g., 18 and 20, respectively). A capacitor (e.g., 71) is above the first and second transistors and comprises a container-shape conductive first capacitor node (e.g., 42) electrically coupled with a first current node (e.g., 26) of the first transistor. A conductive second capacitor node (e.g., 46/64/62) is electrically coupled with a first current node (e.g., 26) of the second transistor. A capacitor dielectric material (e.g., 44) is between the first capacitor node and the second capacitor node. The capacitor dielectric material extends across a top (e.g., 43) of the container-shape first capacitor node. Any other attribute(s) or aspect(s) as shown and/or described above may be used.

In one embodiment, a memory cell comprises first and second transistors laterally displaced relative one another. A capacitor is above the first and second transistors and comprises a conductive first capacitor node (independent of whether of a container-shape) electrically coupled with a first current node of the first transistor. A conductive second capacitor node is electrically coupled with a first current node of the second transistor. A capacitor dielectric material is between the first and second capacitor nodes. The second capacitor node is directly against a top (e.g., 59) of the capacitor dielectric material that is between the first and second capacitor nodes. Any other attribute(s) or aspect(s) as shown and/or described above may be used In one embodiment, a 2T-1C one capacitor memory cell comprises first and second transistors laterally displaced relative one another. A capacitor is above the first and second transistors. The capacitor comprises a conductive first capacitor node (independent of whether of a container-shape) directly above and electrically coupled with a first current node of the first transistor. A conductive second capacitor node is directly above the first and second transistors and electrically coupled with a first current node of the second transistor. A capacitor dielectric material is between the at least at an elevationally-outer portion first and second capacitor nodes. The second capacitor node comprises an elevationally-extending conductive pillar (e.g., 67) directly above the first current node of the second transistor. The conductive pillar has an elevationally outer portion that is of hourglass shape in horizontal cross-section. The conductive pillar may have its entire elevational thickness in respective horizontal cross-sections of an hourglass shape, or may have elevationally inner portions thereof not of such shape. In one embodiment, the memory cell occupies a maximum horizontal area of no more than $5.2F^2$, where "F" is minimum horizontal width of a smaller, if any, of the top of an elevationally outermost surface the first current node of the first and second transistors (e.g., $5.2F^2$ in FIG. 22). In one such embodiment, the maximum horizontal area is less than $5.2F^2$ (FIG. 24). Any other attribute(s) or aspect(s) as shown and/or described above may be used.

CONCLUSION

In some embodiments, a memory cell comprises first and second transistors laterally displaced relative one another. A capacitor is above the first and second transistors. The capacitor comprises a container-shape conductive first capacitor node electrically coupled with a first current node of the first transistor, a conductive second capacitor node electrically coupled with a first current node of the second transistor, and a capacitor dielectric material between the first capacitor node and the second capacitor node. The capacitor dielectric material extends across a top of the container-shape first capacitor node.

In some embodiments, a memory cell comprises first and second transistors laterally displaced relative one another. A capacitor is above the first and second transistors. The capacitor comprises a conductive first capacitor node electrically coupled with a first current node of the first transistor, a conductive second capacitor node electrically coupled with a first current node of the second transistor, and a capacitor dielectric material between the first and second capacitor nodes. The second capacitor node is directly against a top of the capacitor dielectric material that is between the first and second capacitor nodes.

In some embodiments, a two transistor-one capacitor memory cell comprises first and second transistors laterally displaced relative one another. A capacitor is above the first and second transistors. The capacitor comprises a conductive first capacitor node directly above and electrically coupled with a first current node of the first transistor, a conductive second capacitor node directly above the first and second transistors and electrically coupled with a first current node of the second transistor, and a capacitor dielectric material between the first and second capacitor nodes. The second capacitor node comprises an elevationally-extending conductive pillar directly above the first current node of the second transistor. The conductive pillar has an elevationally outer portion that is of hourglass shape in horizontal cross-section.

In some embodiments, a method used in fabricating integrated circuitry comprises forming a plurality of rows of pillar openings that are inter-row staggered. A pillar is formed in individual of the pillar openings. The pillars project elevationally outward relative to an upper surface of material in which the pillar openings were formed. A ring of masking material is formed circumferentially about the individual pillars. The rings form individual mask openings defined by four immediately-surrounding of the rings that are in immediately-adjacent of the rows and that are intra-row-staggered with and between immediately-adjacent of the pillar openings. The rings and pillars are used as a mask while etching the material in which the pillar openings were formed through the mask openings to form individual via openings that are intra-row-staggered with and between immediately-adjacent of the pillar openings. Conductive material is formed in the individual via openings directly electrically coupled with an operative circuit component formed in one of four of the pillar openings that immediately-surround the individual via openings.

In some embodiments, a method of forming an array of two transistor-one capacitor memory cells comprises forming columns of sense lines. Rows of elevationally-extending first and second intra-row-alternating field effect transistors are formed and that individually have an elevationally inner of their source/drain regions electrically coupled to individual of the sense lines. The first and second transistors comprise access lines above the sense lines. Individual of the first and second transistors comprise a gate comprising part of individual of the access lines. A plurality of capacitor openings is formed and that individually extend to an elevationally outer source/drain region of the individual first transistors. A capacitor pillar is formed in individual of the capacitor openings. The capacitor pillar comprises a conductive first capacitor node electrically coupled with individual of the elevationally outer source/drain regions of the individual first transistors, a conductive second capacitor node, and a capacitor dielectric material between the first and second capacitor nodes. Material in which the capacitor openings were formed is recessed to result in uppermost portions of the capacitor pillars projecting elevationally outward relative to an upper surface of the material in which the capacitor openings were formed. A ring of masking material is formed circumferentially about the projecting portions of individual of the capacitor pillars. The rings form individual mask openings defined by four immediately-surrounding of the rings in immediately-adjacent of the rows and that are intra-row-staggered with and between immediately-intra-row-adjacent of the capacitor openings. The rings and pillars are used as a mask while etching the material in which the capacitor openings were formed through the mask openings to form individual via openings to individual of elevationally outer source/drain regions of the individual second transistors. The projecting portions of the capacitor pillars and the rings are removed from being above the material in which the capacitor openings were formed. Conductive material is formed in the individual via openings electrically coupled to the individual elevationally outer source/drain region of the individual second transistors and electrically coupled with one of four immediately-surrounding of the capacitor pillars.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
first and second transistors laterally displaced relative one another; and
a capacitor above the first and second transistors; the capacitor comprising a container-shape conductive first capacitor node electrically coupled with a first current node of the first transistor, a conductive second capacitor node electrically coupled with a first current node of the second transistor, and a capacitor dielectric material between the first capacitor node and the second capacitor node; the capacitor dielectric material extending across a top of the container-shape first capacitor node.

2. The memory cell of claim 1 wherein the first and second transistors are each elevationally-extending.

3. The memory cell of claim 2 wherein the first and second transistors are each vertical or within 10° of vertical.

4. The memory cell of claim 1 wherein the capacitor dielectric material is directly against the top of the container-shape first capacitor node.

5. The memory cell of claim 1 wherein the second capacitor node is directly against a top of the capacitor dielectric material.

6. The memory cell of claim 1 wherein the first capacitor node is directly above the first current node of the first transistor.

7. The memory cell of claim 1 wherein the second capacitor node is directly above the first current node of the second transistor.

8. The memory cell of claim 7 wherein the second capacitor node is directly above the first current node of the first transistor.

9. The memory cell of claim 1 wherein the first capacitor node is directly electrically coupled with the first current node of the first transistor and the second capacitor node is directly electrically coupled with the first current node of the second transistor.

10. The memory cell of claim 1 wherein the first and second transistors are in a common horizontal plane relative one another.

11. The memory cell of claim 1 wherein the container-shape first capacitor node and the first transistor are longitudinally coaxial.

12. A memory cell comprising:
first and second transistors laterally displaced relative one another; and
a capacitor above the first and second transistors; the capacitor comprising a conductive first capacitor node electrically coupled with a first current node of the first transistor, a conductive second capacitor node electrically coupled with a first current node of the second transistor, and a capacitor dielectric material between the first and second capacitor nodes; the second capacitor node being directly against a top of the capacitor dielectric material that is between the first and second capacitor nodes.

13. The memory cell of claim 12 wherein the first capacitor node comprises a container-shape.

14. A two transistor-one capacitor memory cell comprising:
first and second transistors laterally displaced relative one another; and
a capacitor above the first and second transistors; the capacitor comprising a conductive first capacitor node directly above and electrically coupled with a first current node of the first transistor, a conductive second capacitor node directly above the first and second transistors and electrically coupled with a first current node of the second transistor, and a capacitor dielectric material between the first and second capacitor nodes; the second capacitor node comprising an elevationally-extending conductive pillar directly above the first current node of the second transistor, the conductive pillar having an elevationally outer portion that is of hourglass shape in horizontal cross-section.

15. The memory cell of claim 14 wherein the pillar and the second transistor are longitudinally coaxial.

16. The memory cell of claim 14 wherein laterally-extending end surfaces of the hourglass shape are concave.

17. The memory cell of claim 14 wherein longitudinally-extending side surfaces of the hourglass shape are circularly concave between longitudinal ends of the hourglass shape.

18. The memory cell of claim 14 wherein the memory cell occupies a maximum horizontal area of no more than $5.2F^2$, where "F" is minimum horizontal width of a smaller, if any, of the top of an elevationally outermost surface the first current node of the first and second transistors.

19. The memory cell of claim 18 wherein the maximum horizontal area is less than $5.2F^2$.

\* \* \* \* \*